US011448665B2

(12) United States Patent
Amelio (10) Patent No.: US 11,448,665 B2
(45) Date of Patent: Sep. 20, 2022

(54) HEATING DEVICE FOR CARRYING OUT TEMPERATURE-DEPENDENT TESTS ON ELECTRONIC COMPONENTS ARRANGED IN A SOCKET

(71) Applicant: MICROTEST S.R.L., Vicopisano (IT)

(72) Inventor: Giuseppe Amelio, Lucca (IT)

(73) Assignee: MICROTEST S.R.L., Vicopisano (IT)

( * ) Notice: Subject to any disclaimer, the term of this patent is extended or adjusted under 35 U.S.C. 154(b) by 249 days.

(21) Appl. No.: 16/958,305

(22) PCT Filed: Oct. 12, 2018

(86) PCT No.: PCT/IB2018/057916
§ 371 (c)(1),
(2) Date: Jun. 26, 2020

(87) PCT Pub. No.: WO2019/082014
PCT Pub. Date: May 2, 2019

(65) Prior Publication Data
US 2021/0096156 A1    Apr. 1, 2021

(30) Foreign Application Priority Data

Oct. 26, 2017    (IT) .................. 102017000121768

(51) Int. Cl.
*G01R 31/28*    (2006.01)
*G01R 1/04*    (2006.01)

(52) U.S. Cl.
CPC ....... *G01R 1/0458* (2013.01); *G01R 31/2863* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS 4,607,220 A      8/1986 Holtman
5,911,897 A *    6/1999 Hamilton ................ H01L 23/34
                                                  219/209

(Continued)

FOREIGN PATENT DOCUMENTS

EP         3 173 798 A1     5/2017

OTHER PUBLICATIONS

The International Bureau of WIPO, "International Preliminary Report on Patentability", in Application No. PCT/IB2018/057916, dated Apr. 28, 2020, 9 pages.

(Continued)

*Primary Examiner* — Tung X Nguyen
(74) *Attorney, Agent, or Firm* — Hickman Becker Bingham Ledesma LLP (57) ABSTRACT

The present invention concerns a heating assembly (10, 15) for generating heat in order to carry out temperature-dependent tests on an electronic component (3, 200) arranged inside a socket (2), the heating assembly (10, 15) comprising: A heating device (10) comprising an electrically conductive material (25) in such a manner as to allow the passage of an electrical current to produce heat. According to the invention, the assembly further comprises: A covering (15) of a thermally insulating material suitable for containing said heating device (10) inside, the covering having at least one opening at one side for allowing the heat diffusion through said opening; Fastening means for fastening said covering (15) to a support surface (5B), in such a manner that, while used, the heating device (10), arranged inside said covering (15), faces said support surface (5B) through said opening.

17 Claims, 4 Drawing Sheets

(56) References Cited

U.S. PATENT DOCUMENTS

| | | | |
|---|---|---|---|
| 2005/0206368 A1* | 9/2005 | Lopez | G01R 31/2891 |
| | | | 374/E1.021 |
| 2014/0167806 A1 | 6/2014 | Ju et al. | |
| 2015/0084657 A1 | 3/2015 | Clairet et al. | |
| 2015/0204942 A1 | 7/2015 | Scocchetti | |

OTHER PUBLICATIONS

European Patent Office, "Search Report" in application No. PCT/IB2018/057916, dated Dec. 20, 2018, 4 pages.

* cited by examiner

HEATING DEVICE FOR CARRYING OUT TEMPERATURE-DEPENDENT TESTS ON ELECTRONIC COMPONENTS ARRANGED IN A SOCKET

TECHNICAL FIELD

The present invention concerns the technical field of electronic components in general and in particular the electronic devices, such as the socket, which are used in order to test other electronic components.

Therefore, the invention refers to an innovative heating assembly which allows to carry out temperature-dependent tests on electronic components arranged in the suitable socket in an easy and versatile manner, in particular for testing BGA components.

BACKGROUND ART

The socket is a known testing device to test other electronic components (the so-called DUT "Device Under Test"). In particular, the "socket" is a sort of cradle which is fixed to a printed circuit board, named with the acronym P.C.B, that is Printed Circuit Board. Such a cradle of the socket has electrical contacts communicating with the P.C.B. and it is made in such a manner as to form a housing in which the electric component to be tested is arranged (a DUT, such as a further printed circuit board or a processor). The housing is equipped with other electric contacts connecting with the component to be tested (DUT) in such a manner that the signal emitted by the P.C.B. can be transferred to the component to be tested by means of the socket on which the component is arranged. The P.C.B. sends all the electric signals necessary for the test and in this manner, the correct operation of the electronic component is verified, depending on the kind of test to be carried out.

It is known that many standard tests have to be carried out at predetermined temperatures, which are well above the room temperature (for example around 130° C.) and such a temperature has to be maintained for a predetermined number of hours.

For this purpose, suitable cabinets are provided in the state of the art, acting as ovens and thus equipped with suitable heating system. The various sockets, on which the components to be tested have to be arranged, are arranged in such cabinets.

It is obvious that such an embodiment is particularly complex and expensive, as it requires bulky heating structures with expensive maintenance costs.

In order to overcome such a technical inconvenience, the same applicant filed a previous European patent application EP3173798 which discloses a new, particularly compact, efficient and cheap heating device. The publication EP3173798 is to be considered fully incorporated by reference in the present description.

Such a publication discloses a heating device in the form of a conductive multi-layer with resistances incised directly on the conductive layers, and through which a heating is obtained by Joule effect.

Therefore, the shape of the device is a tablet formed by many layers, suitably applied into the housing of the socket below the component to be tested. A voltage is applied and the passage of current in the incised resistances allows the heat production by Joule effect.

Nevertheless, such an embodiment cannot be applied inside sockets destined to test BGA components (acronym for Ball Grid Array). In fact, in this case, the structure of the BGA has an array of contacts which covers almost its whole surface and the socket is equipped with a numerous succession of metallic needles which form the pins of electric contact engaged with the array of contacts of the BGA on one side and with the contacts of the P.C.B. on the opposite side.

In this manner, such a structure of the socket and the BGA component to be inserted in the socket has no suitable area for applying the heating device described in such European application directly below the component to be tested inside the socket.

Substantially, the overall structure of the heating device described in the previous patent application is not specifically suitable for such an application and therefore, it cannot be used.

SUMMARY OF THE INVENTION

It is therefore the aim of the present invention to furnish a heating assembly (10, 15) which solves at least in part the above-mentioned technical inconveniences.

In particular, the aim of the present invention is to furnish a heating assembly (10, 15) which can be applied to any socket, and in particular to those destined to test the BGAs, in a suitable position to carry out a test at a predetermined temperature.

The aim of the present invention is also to furnish a heating assembly (10, 15) easily, cheaply and functionally allowing to carry out temperature-dependent tests on any socket and in particular on the BGA device as it is inserted in its suitable socket.

Therefore, these and other aims are achieved with the present heating assembly (10, 15) for generating heat with the aim of carrying out temperature-dependent tests on an electronic component (3, 200) arranged inside a socket (2), according to claim 1.

Such a heating assembly (10, 15) comprises:

A heating device (10) comprising an electrically conductive material (25) in such a manner as to allow the passage of electrical current to produce heat. Therefore, the heat is produced by Joule effect.

According to the invention, the assembly further comprises:

A covering (15) of thermally insulating material, that is substantially adiabatic, for limiting the heat dispersion and suitable for containing said heating device (10) inside. Therefore, the covering holds heat inside but it has at least one area for the passage which allows, through said passage, the diffusion of heat outwards of the covering, for example by means of a simple opening through which the heat can flow.

Moreover, fastening means are comprised for fastening said covering (15) to a support surface (5B), in such a manner that, in use, the heating device (10) arranged inside said covering (15) faces said support surface (5B) through said passage area.

In this manner, all the above-mentioned technical inconveniences are easily solved.

In particular, thanks to the adiabatic covering 15, the heating device inside the covering can produce heat which is directed outwardly through the passage obtained in the covering itself. Therefore, as the covering with the heating device inside is applied to a support surface which forms the printed circuit board for the tests, the whole assembly, formed by the covering and the heating device, can be arranged outwards the socket in a convenient position such that the heat flow hits the socket with the component 3 to be tested inside it.

In this manner, it is formed an environment with controlled temperature with no need to apply the single heating device into the socket but, instead, by suitably applying it outside the socket in a convenient position.

Therefore, the adiabatic container acts not only as a support to apply the heating device 10 outside the socket, but, moreover, it forms an adiabatic barrier which limits the heat dispersion, by directing the heat flow towards the socket.

Advantageously, such fastening means are of the removable type in such a manner that said heating assembly (10, 15) can be applied to said support surface (5B) in a removable manner.

Advantageously, said passage area can be in the form of at least an opening realized in the covering.

Advantageously, a layer of thermally conductive material applied in correspondence of the said passage area of the covering can be further comprised in order to facilitate the heat transfer.

More precisely, advantageously, said layer of thermally conductive material is arranged in correspondence of the surface of the heating device (10) in such a manner as to obstruct at least in part said opening for the passage of heat such that said layer is interposed between the support surface (5B), to which the heating assembly is applied in use, and the surface of the device (10) which faces said area for the passage of heat.

Advantageously, said heating device (10) is in the form of a multi-layer.

In this manner, the sizes are compacted.

Advantageously, the multi-layer comprises one or more layers of electrically conductive material and wherein a layer of electrically conductive material (25) is insulated from a further layer of electrically conductive material (25) by means of the interposition of a layer of insulating material (30), at least one or more of said layers of electrically conductive material comprising a resistance (33) for the passage of current.

Advantageously, said resistance (33) is in the form of an incision obtained directly on the layer of electrically conductive material (25).

Such an embodiment helps to compact the sizes.

Advantageously, the container (15) can be made at least in part of thermally insulating materials, such as:
Plastic;
Teflon plastic;
PEEK;
Aerogel;
Silicone foam.

Such materials are not to be considered limiting and other thermally insulating materials, also with different insulating degrees, can be equally used without going beyond the scope of the present invention.

Here it is also disclosed a printed circuit board (5) comprising an upper surface (5A) on which a socket (1) can be arranged, preferably a socket for testing a component (3) of BGA type, a lower surface (5B) and a plurality of electric contacts for transmitting the electric signal to said socket (1).

According to the invention, the printed circuit board (5) comprises a heating assembly (10, 15) as disclosed above, applied in a fixed or removable manner.

Moreover, advantageously, said heating assembly is applied in correspondence of the surface (5B), substantially inside the area delimiting the housing of said array of electrical connections, in such a manner as to be in axis below the socket.

BRIEF DESCRIPTION OF THE DRAWINGS

Further features and advantages of the present heating assembly (10, 15), will become apparent from the following description of some preferred embodiments thereof, given only by way of non-limiting, indicative, example, with reference to the accompanying drawings, wherein:

FIGS. 3 to 5 depict a constructive detail of the heating device already described in the previous European application EP3173798, and moreover fully incorporated by reference here; in particular

DESCRIPTION OF SOME PREFERRED EMBODIMENTS

Figure 1:
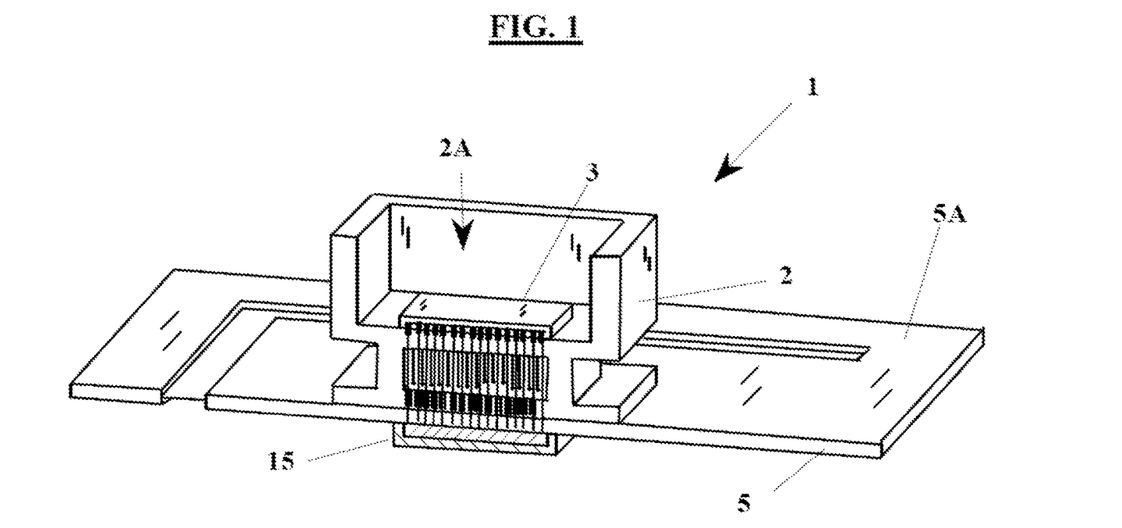
FIG. 1 depicts a socket 2 in which a BGA device 3 to be tested is arranged; the socket is assembled on a printed circuit board P.C.B. 5 and, on the opposite side, it is highlighted the heating assembly object of the invention always applied to the P.C.B. 5.

FIG. 1 depicts an overall axonometric view.

In particular, number 5 indicates the printed circuit board P.C.B., having an upper surface 5A and a lower surface 5B.

Figure 2:
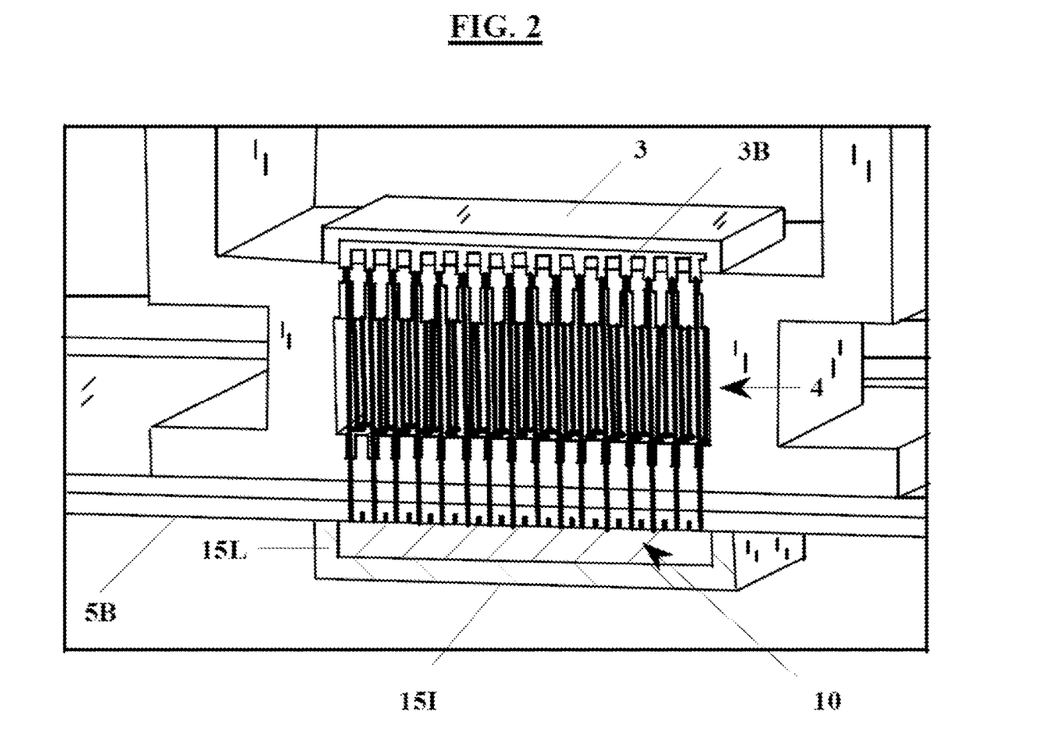
FIG. 2 is an enlarged detail of FIG. 1 better depicting the heating assembly object of the invention.

The socket 1 is applied in correspondence of the upper surface 5A, having a structure 2 which forms a cradle 2A into which is inserted the component 3 to be tested, in particular the component BGA 3 formed, as it is well inferable from FIG. 2, by an array of contacts 3b distributed on its surface.

Such arrays of contacts 3B, as better highlighted in the enlarged view of FIG. 2, are connected by means of electric contacts in form of needles 4 penetrating through the socket to be connected to the electric contacts provided on the underlying P.C.B. 5.

In this manner, according to the known art, it is possible to test the component 3, by sending suitable electric signals of tests which start from the P.C.B.

As it is inferable from FIG. 2, a heating device 10 which produces heat by Joule effect is not directly applicable inside the socket below the component 3, therefore inside the cradle 2A, due to the plurality of contacts 3B present in the component to be tested.

It could be potentially arranged inside the cradle 2A above the component 3 but this arrangement would be absolutely useless as the heat flow would go upwards without hitting the component 3.

Therefore, there is the need to easily apply a heating device substantially as the one disclosed in the reference application EP3173798.

For solving this issue, it has been realized an assembly (10, 15) which can be applied externally, and in particular below the socket.

This assembly is formed by a container 15 (or also a covering) which contains the heating device 10 inside.

The container (or covering) is made of thermally insulating material and is configured to be applicable, in a removable manner, to the side 5B of the P.C.B., therefore on the opposite side with respect to that where the socket is fastened.

The container can have a simple box-like shape so as to form a housing in which to arrange the device 10.

As can be inferred from FIG. 2, the container 10 is arranged substantially in axis with respect to the longitudinal axis of the socket in such a manner that the produced heat fully hits the component to be tested, while flowing upwards.

The container 15 is obviously open by a part thereof so that, as depicted in FIG. 2, in use, the device 10 contacts the surface 5B radiating heat towards the above component 3.

In this manner, the heat produced by the device 10 can freely radiate upwards, and therefore towards the overlying socket and towards the component 3 to be tested, but the heat is prevented from dispersing downwards and laterally, thanks to the insulating walls forming the container itself.

Therefore, this system allows an easy application to any printed circuit board P.C.B. by making the heat flow converging towards the component to be tested.

The container can be made of various thermally insulating materials.

In a non-limiting way, for example, it is possible to cite materials such as plastic, Teflon plastic, PEEK or aerogel which is a silica gel containing micro-bubbles of air inside. Other usable thermally insulating materials can be, for example, silicone foam.

Common materials internally or externally coated with materials with thermally insulating properties can also be used.

Therefore, the box-shaped container is provided with lateral walls 15L and a lower wall 15I and is open on the opposite side to the wall 15I, so that the heating device can contact the wall 5B and radiate heat from this opening.

The walls are obviously continuous to avoid the heat dispersion and therefore do not have significant openings or openings that imply a dispersion of heat.

In this manner, the housing formed by these walls does not dissipate heat.

The electric power supply for the heating device 10 occurs by connecting or welding the upper surface, that is the P.C.B. 5.

For example, the thermally insulating container form can generally be box-shaped, of rectangular or quadrangular type, in such a manner as to retrace the shape of the heating device 10 which is contained.

Obviously, other box-shaped forms, such as cylindrical, can be realized.

Figure 6:
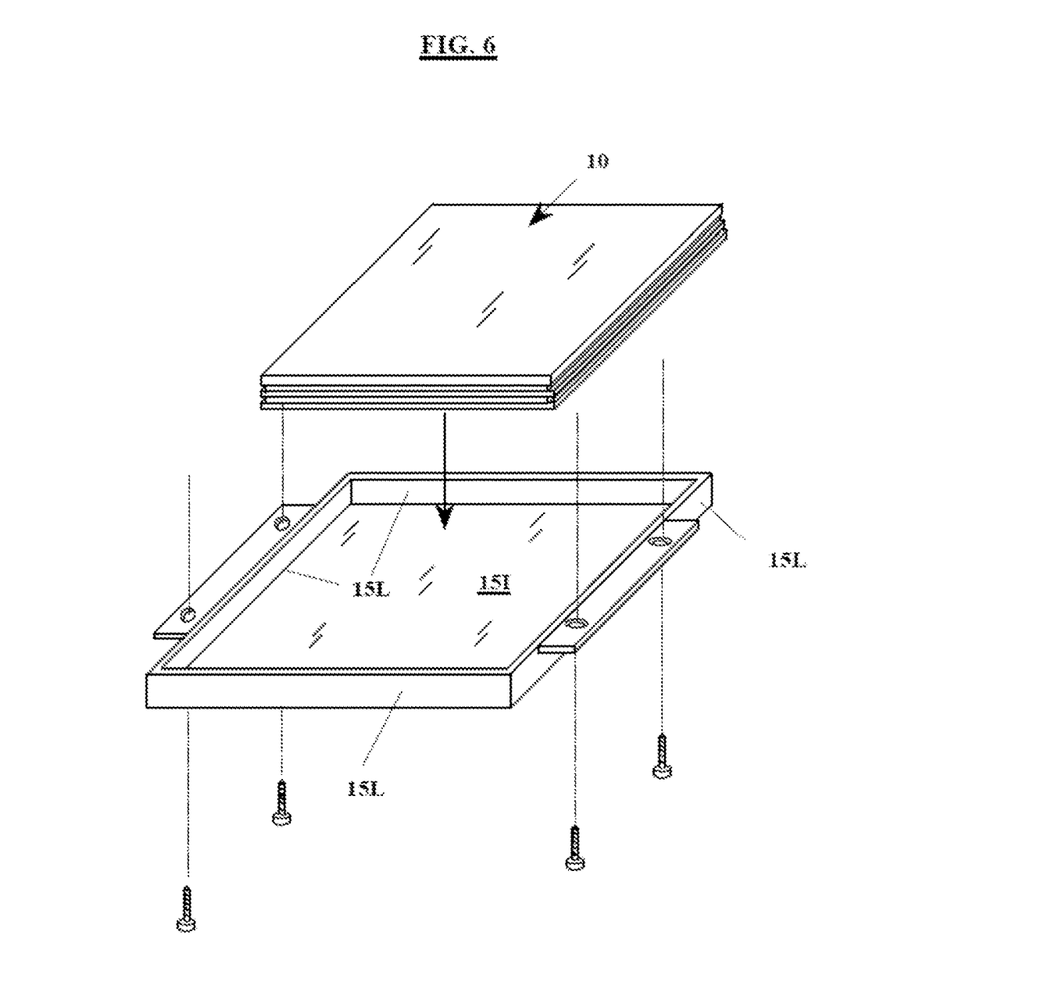
FIG. 6 is an axonometric view for highlighting the assembly as a whole including the box-shaped covering in which the multilayer device 10 is inserted; the whole, for example thanks to the screws, can be fastened as depicted in FIG. 1 or FIG. 2.
Figure 7:
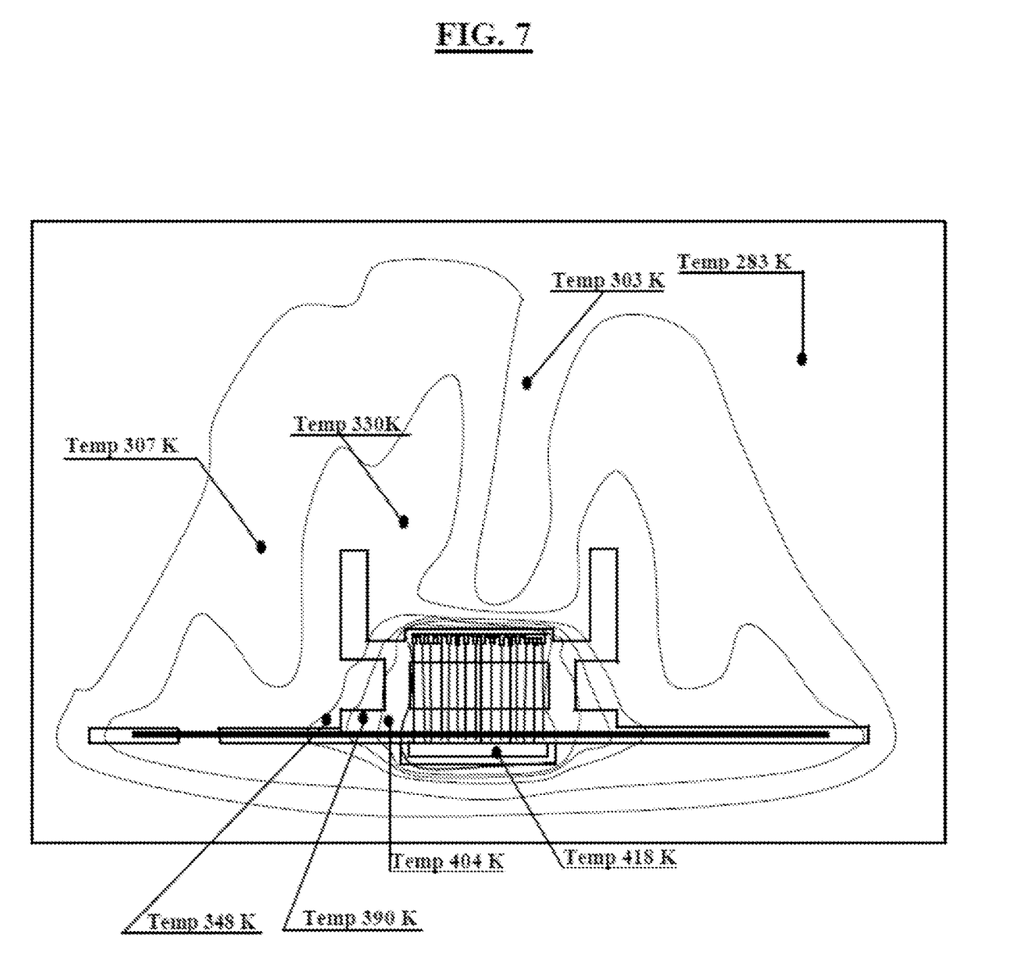
FIG. 7 depicts the heat advancement according to a simulation test and highlights the high heat concentration (approximately 145 Celsius degrees) obtained in the area of the component to be tested, thanks to the underlying application of the described assembly.

Preferably, the container 10 is equipped with some lateral flanges, which extend radially from the lateral walls 15L (see for example FIG. 6) and which are intended for the fastening to the surface 5B. Such flanges, two for example, lean against the surface 5B and they can have holes which are arranged in axis with the relative holes obtained on the printed circuit board 5 for inserting some fixing screws. In this manner, the application is firm and quick and the whole assembly (10, 15) can easily be applied and then removed.

Experimental evidence proved that a layer or a sheet of a thermally conductive material can be interposed between the surface 5B and the heating device 10 in such a way that the heating device does not touch such a surface 5B directly.

Substantially, a thin sheet of a thermally conductive material can be interposed between the surface 5B and the surface of the device 10. It remarkably favours the heat diffusion upwards, that is towards the device to be tested, thus optimizing further the heat flow and the thermal conditions for carrying out the test.

For example, a material that can be used for realizing such a thermally conductive sheet can be a material with the trade-name "Berquist Gap Pad 5000 s35", brand name Henkel.

Even if the above-mentioned material proved to be optimal for the purposes, other thermally conductive material can be used without however moving away from the scope of the present invention.

The heating device 10 contained inside the container 15 is substantially the one described in the application EP3173798 and described below for clarity purposes.

Such a heating device is equipped with at least one resistance through which electric current is passed, such that it is heated by Joule effect and therefore produces the heat necessary for heating the component to be tested.

By suitably adjusting the passage of current, the desired temperature can be easily obtained and controlled.

Figure 3:
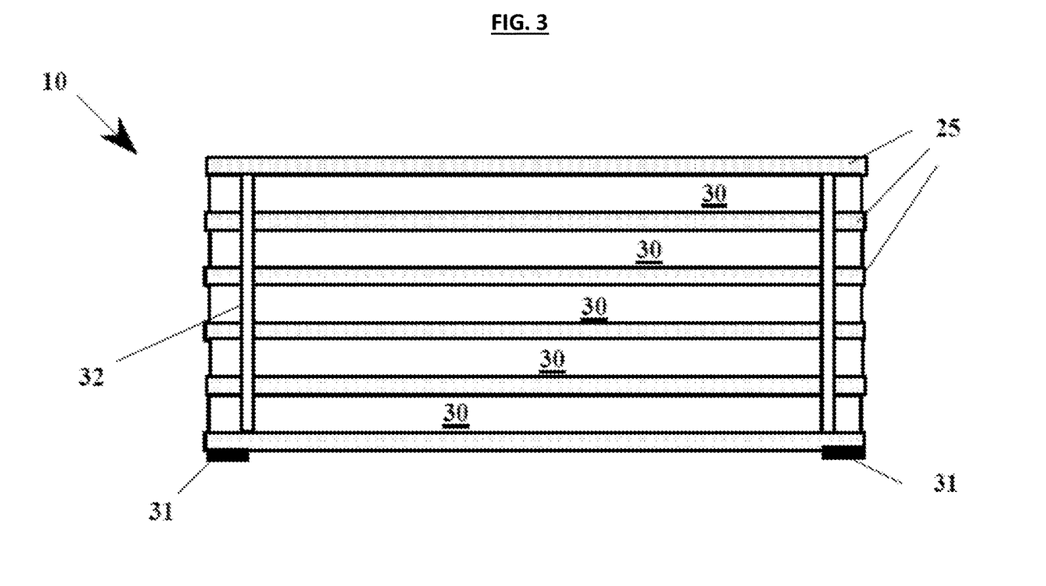
FIG. 3 depicts the multilayer structure of the heating device 10.

In more details, as depicted in the section of FIG. 3, such a heating element 10 is realized through a plurality of overlapping layers (25, 30) (preferably six conductive layers).

Therefore, it is in the form of a multi-layer.

In particular, conductive layers 25 are provided, preferably of metallic material such as copper, interposed to insulating layers 30, preferably polyamide.

The purpose of the insulating layer is to prevent said conductive layers from short-circuiting to each other, thus insulating them from each other.

Therefore, each layer forms a surface of predetermined thickness and overlapped to each other as per the section of FIG. 3.

Any shape can be provided, such as a square, rectangular or circular metal tablet.

The thicknesses are quite reduced, approximately a millimeter as a whole.

Figure 4:
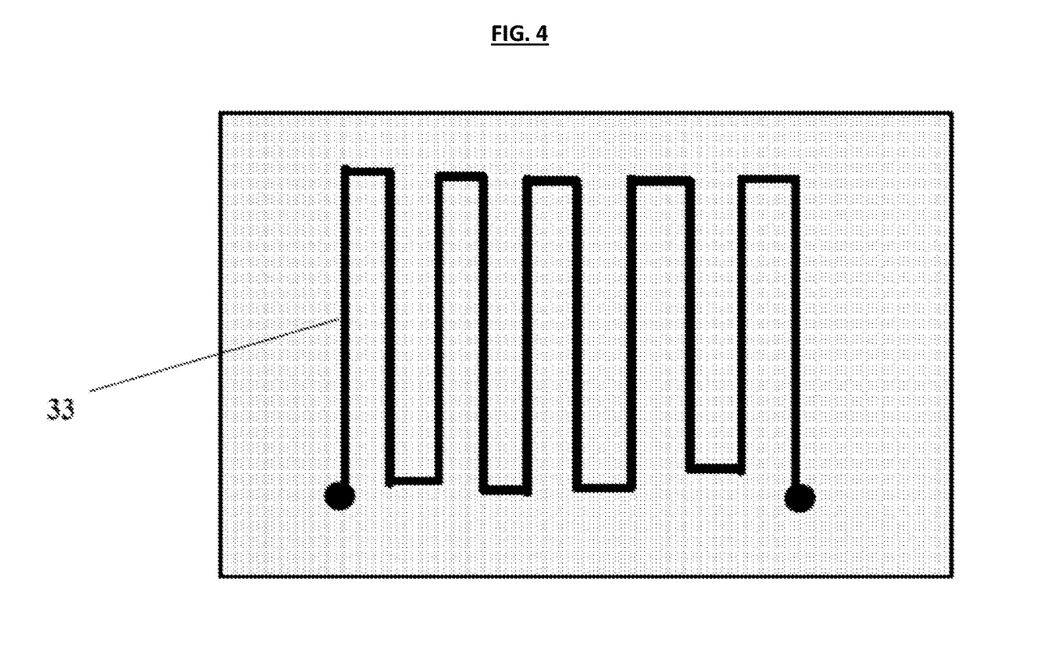
FIG. 4 depicts a resistance 33 preferably obtained by means of an incision obtained directly in the conductive material of the heating device 10 and FIG. 5 depicts an example of heat diffusion towards a generic component 200 to be tested.

As highlighted in the section of FIG. 4, a conductive track 33 is obtained on one or more conductive layers, in such a manner as to generate a resistance for the passage of current.

The resistance is preferably obtained by removing and then carving the layer according to the desired geometry (generally a sort of wavy line).

The first and the last conductive layer are preferably gold covered or plated for protecting them from corrosion. Preferably, but not necessarily, the resistance is not obtained on them and their purpose, as they are metallic, is to better give off the heat outwards.

The realization of resistances by means of an incision of a track directly on the surface of the conductive material (therefore, by removing material) has the great advantage of making the device more compact with a particularly simple productive process, contrary to an embodiment where the track is obtained by pouring a conductive material which generates an increase of thickness.

Figure 5:
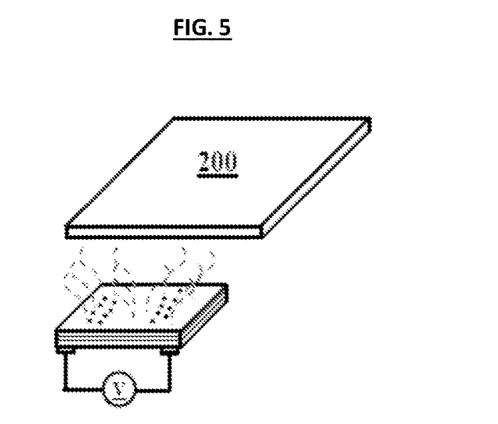

A plurality of micro holes passing through the whole thickness of the device 10 is then provided. Such micro-holes are preferably covered by metal inside and their purpose is to favour the heat diffusion further. In this manner, the heat radiates towards the overlying component to be tested in a more efficient manner (see for example FIG. 5).

As then depicted in FIG. 3, the contacts 31 are provided, through them such a device 10 is connected to a voltage for generating the passage of electric current. Therefore, the contact 31 connects to a complementary contact. The contacts are preferably obtained on the first metallic plate 31 which, as mentioned, can be lacking the resistance track and is connected with the circuit board 5.

Moreover, in order to make current pass through all the layers equipped with track, they are connected to each other by means of one or more ducts 32, in which an electric wire passes and physically connects all the copper layers to each other for injecting the voltage of the passage of current.

The advantage of realizing a multi-layer element is that it is possible to maintain extremely reduced sizes while obtaining a high heat at the same time. In fact, a track for the passage of current can be obtained on each layer, and, therefore, the more layers there are, the greater the heat produced, while maintaining at the same time reduced encumbrances (the structure increases its height but not its width).

Therefore, such a device can be miniaturized at will.

Moreover, the realization of incised tracks further contributes to reduce thicknesses.

Moreover, it is possible to provide on one of the conductive layers, preferably on one of the two external ones, a contact with an electric wiring connectable to an external control device (for example a PC). In this manner, it is easy to monitor the reached temperature and adjust and vary it depending on needs, by increasing or reducing the passage of current.

Such an assembly (10, 15) can be an independent component, therefore produced and sold independently and easily applicable to any printed circuit board P.C.B. for testing components 3 by means of the above-mentioned rapid fastening means, such as screws or snap systems.

Alternatively, it can be already in-built in the P.C.B. or in a socket for carrying out such tests.

While in use, therefore, it is sufficient to apply such a heating assembly (10, 15) on the lower surface 5B of the circuit board P.C.B. 5, that is, below the socket, and inject current to produce heat.

The thermally insulating box will conduct the heat diffusion towards the socket and therefore towards the component 3 to be tested.

The interposition of a thermally conductive layer favours further the heat diffusion towards the component to be tested.

Even if the present invention is preferably intended for testing BGA components, its use as described is not excluded for testing any component 200 arranged inside a socket, even if there is sufficient space to insert directly into the socket the device 10 below the component to be tested.

Therefore, its applicability outwards allows the sizes of the heating device 10 not to be necessarily bound to the size 2A of the housing of the socket, thus making the system very versatile.

The invention claimed is:

1. A heating assembly (10, 15) for generating heat and carrying out temperature-dependent tests on an electronic component (3, 200) of BGA type when arranged, in use, inside a socket (2) comprising an array of electric contacts engaging with the array of electric contacts of the electronic component, the heating assembly (10, 15) comprising:
   a heating device (10) electrically conductive in such a manner as to allow passage of electrical current to produce heat;
   characterized in that the heating assembly further comprises:
   a covering (15) of a thermally insulating material for limiting heat dispersion and suitable for containing said heating device (10) inside, the covering generally being box-shaped providing lateral walls (15L) and a lower wall (15I) in such a manner as to form a thermally insulated housing for the heating device and having, at the opposite side to said lower wall (15I), at least one opening for allowing heat diffusion outwards of the covering;
   fastening means for fastening said covering (15) to a support surface (5B) outside the socket, said fastening means being arranged in such a manner that, in use, the opening faces said support surface (5B) as the covering is fastened to said support surface.

2. A heating assembly (10, 15), according to claim 1, wherein said lateral walls (15L) and said lower wall (15I) are substantially lacking openings.

3. A heating device (10, 15), according to claim 1, wherein said fastening means are of a removable type in such a manner that said heating assembly (10, 15) can be applied to said support surface (5B) in a removable manner.

4. A heating assembly (10, 15), according to claim 1, wherein said passage is in form of at least one opening realized in the covering.

5. A heating assembly (10, 15), according to claim 1, wherein a layer of thermally conductive material applied in correspondence of said opening of the covering is further comprised in order to facilitate heat transfer.

6. A heating assembly (10, 15), according to claim 5, wherein said layer of thermally conductive material is arranged in correspondence of a surface of the heating device (10) in such a manner as to obstruct at least in part said opening for passage of heat such that said layer is interposed between the support surface (5B), to which is applied the heating assembly in use, and the surface of the heating device (10) which faces said passage of heat.

7. A heating assembly (10, 15), according to claim 1, wherein said heating assembly (10) is in the form of a multi-layer.

8. A heating assembly (10, 15), according to claim 7, wherein the multi-layer comprises one or more layers of electrically conductive material and wherein a layer of electrically conductive material (25) is insulated from a further layer of electrically conductive material (25) by means of interposition of a layer of insulating material (30), at least one or more of said layers of electrically conductive material comprising a resistance (33) for the passage of electrical current.

9. A heating assembly (10, 15), according to claim 8, wherein said resistance (33) is in the form of an incision obtained directly on the layer of electrically conductive material (25).

10. A heating assembly (10, 15), according to claim 1, wherein the covering (15) is made at least in part of thermally insulating materials, such as: Plastic; Teflon plastic; PEEK; Aerogel; Silicone foam.

11. A printed circuit board (5) comprising:
   an upper surface (5A) equipped with an array of contacts on which a socket can be arranged and connected for testing an electronic component (3) of BGA type;

a lower surface (5B), characterized in that the printed circuit board (5) comprises a heating assembly (10, 15) according to claim 1 applied in a fixed or removable manner.

12. A printed circuit board (5), according to claim 11, wherein said heating assembly is applied in correspondence of the lower surface (5B), substantially inside an area delimiting the housing of said array of electrical contacts.

13. A method for carrying out temperature-dependent tests on an electronic component (3, 200) of BGA type equipped with an array of contacts, the method comprising the steps of:
- arrangement of the electronic component (3, 200) of BGA type inside a socket (2) comprising an array of electric contacts engaged with the array of electric contacts of the electronic component;
- arrangement of a heating assembly comprising:
- an electrically conductive heating device (10), preferably multi-layer, in such a manner as to allow passage of electrical current to produce heat;
- a covering (15) of a thermally insulating material for limiting heat dispersion, the covering generally being box-shaped and providing lateral walls (15L) and a lower wall (151), said lateral walls being preferably substantially lacking openings, in such a manner as to form a thermally insulated housing for the heating device and having, at the opposite side to said lower wall (151), at least one opening for allowing heat diffusion outwards of the covering;
- the heating device being arranged inside said covering (15);
- fastening of the said heating assembly, formed by the covering in which the said heating device is arranged, outside the socket in such a manner that the opening for passage of heat faces the socket;
- activation in such a manner that the heating device electrically powered produces heat that radiates towards the electronic component to be tested arranged inside the socket.

14. A method, according to claim 13, wherein said heating assembly is applied below a cradle (2A) into which the electronic component to be tested is arranged.

15. A method, according to claim 13, wherein the socket is connected to a printed circuit board (5) in such a manner that the array of contacts of the socket is to engaged with the arrays of contacts of the said printed circuit board (5) and with the heating assembly which is fastened to the said printed circuit board (5) in correspondence of a side (5B) opposed to that one of connection between the socket and the printed circuit board.

16. A method, according to claim 13, wherein the fastening of the heating assembly occurs by means of fastening screws or removable systems of in general.

17. A method, according to claim 13, wherein an application is provided of a layer of thermally conductive material interposed between a lower surface (5B) and the opening for the passage of heat of said heating assembly (10).

* * * * *